United States Patent

Wermuth

[11] Patent Number: 5,884,151
[45] Date of Patent: Mar. 16, 1999

[54] SWITCHING DEVICE FOR SHORT TIME MUTE SWITCHING OF REPRODUCTION OF NF-SIGNAL IN RADIO RECEIVER

[75] Inventor: Juergen Wermuth, Peine, Germany

[73] Assignee: Robert Bosch GmbH, Stuttgart, Germany

[21] Appl. No.: 875,585

[22] PCT Filed: Jul. 30, 1996

[86] PCT No.: PCT/DE96/01410

§ 371 Date: Jul. 7, 1997

§ 102(e) Date: Jul. 7, 1997

[87] PCT Pub. No.: WO97/20387

PCT Pub. Date: Jun. 5, 1997

[30] Foreign Application Priority Data

Nov. 29, 1995 [DE] Germany ............ 195 44 438.8

[51] Int. Cl.⁶ .................................................. H04B 1/10
[52] U.S. Cl. ...................... 455/223; 455/212; 455/221
[58] Field of Search .................................. 455/212, 218, 455/220, 221, 222, 223, 224, 296; 375/451; 327/403, 405, 415, 417, 478

[56] References Cited

FOREIGN PATENT DOCUMENTS

4326097A1  2/1995  Germany .

*Primary Examiner*—Doris H. To
*Attorney, Agent, or Firm*—Michael J. STriker

[57] ABSTRACT

A circuit arrangement for brief mute switching of the reproduction of an LF signal in a radio receiver for performing additional control operations is described, in which the mute switching is effected by varying the current flow through the control path of an interrupter by means of a reversing switch, as a consequence of the change in charge of a capacitor acted upon by a blanking signal.

6 Claims, 3 Drawing Sheets

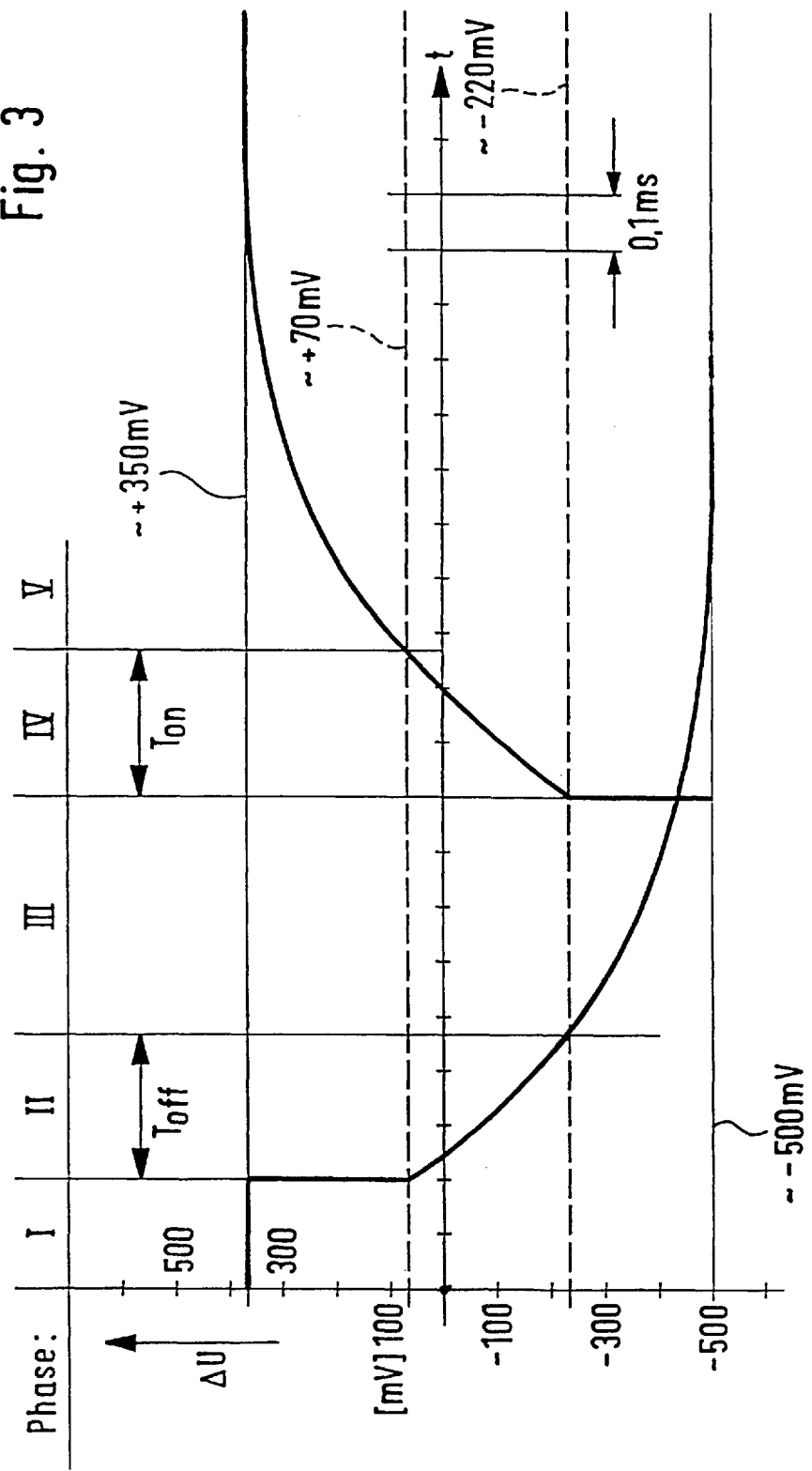

SWITCHING DEVICE FOR SHORT TIME MUTE SWITCHING OF REPRODUCTION OF NF-SIGNAL IN RADIO RECEIVER

The subject of the patent is a circuit arrangement for brief mute switching of the reproduction of an LF signal in a radio receiver, is generically defined by the preamble to claim 1.

BACKGROUND OF THE INVENTION

One such circuit arrangement is known from the earlier German Patent Application P 43 26 097 of the same inventor. This known circuit arrangement attains the object of making extremely brief, hardly perceptible interruptions, free of clicking noises, in the LF signal of the radio receiver in order to carry out additional control operations.

SUMMARY OF THE INVENTION

The object of the present invention was to further improve the transition to the mute-switched or re-activated state in terms of freedom from clicking noises upon an interruption and in terms of avoiding perceptibility of the interruptions themselves.

This object is attained according to the invention by the provisions recited in claim 1.

Advantageous features of the invention are defined by the characteristics of the dependent claims.

BRIEF DESCRIPTION OF THE DRAWINGS

Details of the invention will be described in conjunction with the drawing. To that end.

FIG. 3 shows voltage courses between two reference points of the exemplary embodiment;

DETAILED DESCRIPTION OF THE INVENTION

Figure 1:
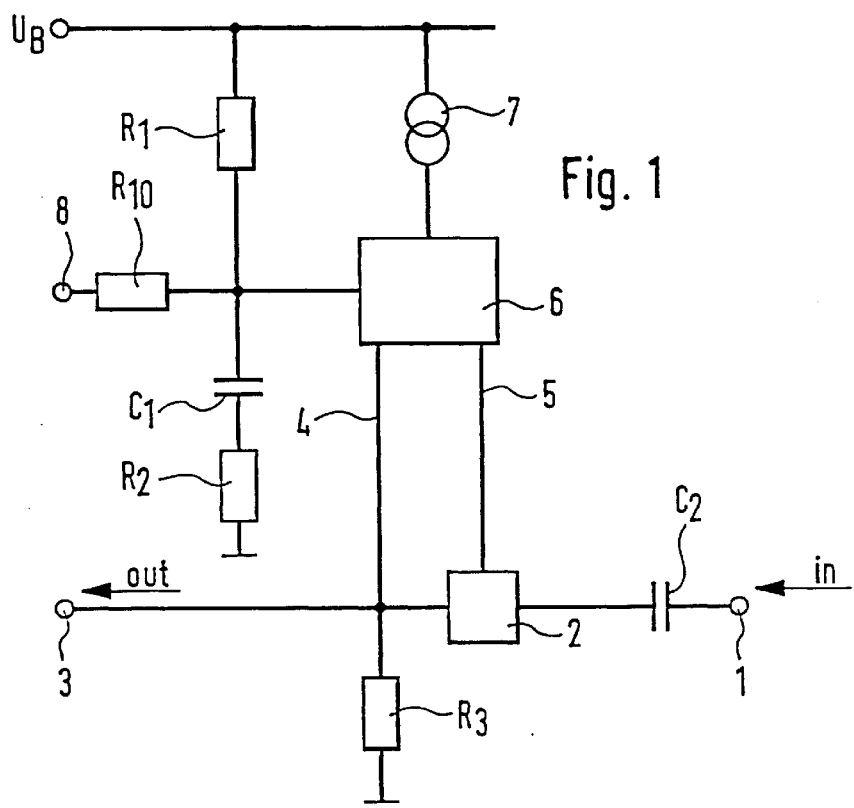
FIG. 1 shows the function circuit diagram of the novel circuit arrangement.

The low-frequency useful signal that is to be interrupted briefly is carried in FIG. 1 from an LF input 1 of the circuit arrangement via a coupling capacitor $C_2$ to a controllable semiconductor system that forms an interrupter 2. The output of the interrupter 2, which is connected to ground, via a resistor $R_3$, simultaneously forms the LF output 3 of the circuit arrangement.

The resistor $R_3$ also defines the DC operating point of the interrupter 2.

Connected to the output of the interrupter 2, that is, to the high point of the resistor $R_3$, is a current branch 4, which is supplied from one output of a reversing switch 6. The current branch 4 is located parallel to the control branch 5 of the interrupter 2, which is connected to the other output of the reversing switch 6. The input of the reversing switch 6 is connected to a constant current source 7, which is connected to the terminal for the supply voltage $U_B$.

The position of the reversing switch 6 is determined by the charge state of the capacitor $C_1$, which is connected to ground via a resistor $R_2$ and to the terminal for the supply voltage $U_B$ via a resistor $R_1$. At the terminal 8, via the resistor $R_{10}$, the blanking pulse is supplied to the high point of the capacitor $C_1$ and to the reversing switch 6. The position of the switch arm of the reversing switch 6 determines whether the current from the constant current source 7 flows via the control path 5 of the interrupter 2 and the resistor $R_3$ or via the current branch 4 and in turn the resistor $R_3$ to ground. In both cases, the same voltage drop occurs at the resistor $R_3$, so that at the LF output 3 no difference can be found, regardless of whether the LF signal itself is precisely equal to zero, or the interrupter 2 is preventing the further conduction of the LF signal. Because the potential at the high point of the resistor $R_3$ remains constant, there is no charge reversal of the coupling capacitor $C_2$, either, upon the mute switching or the cancellation thereof.

Thus no voltage changes, which could be the cause of clicking noises in the circuit, not shown in detail, connected to the output 3 of the circuit arrangement occur in the circuit arrangement.

Figure 2:
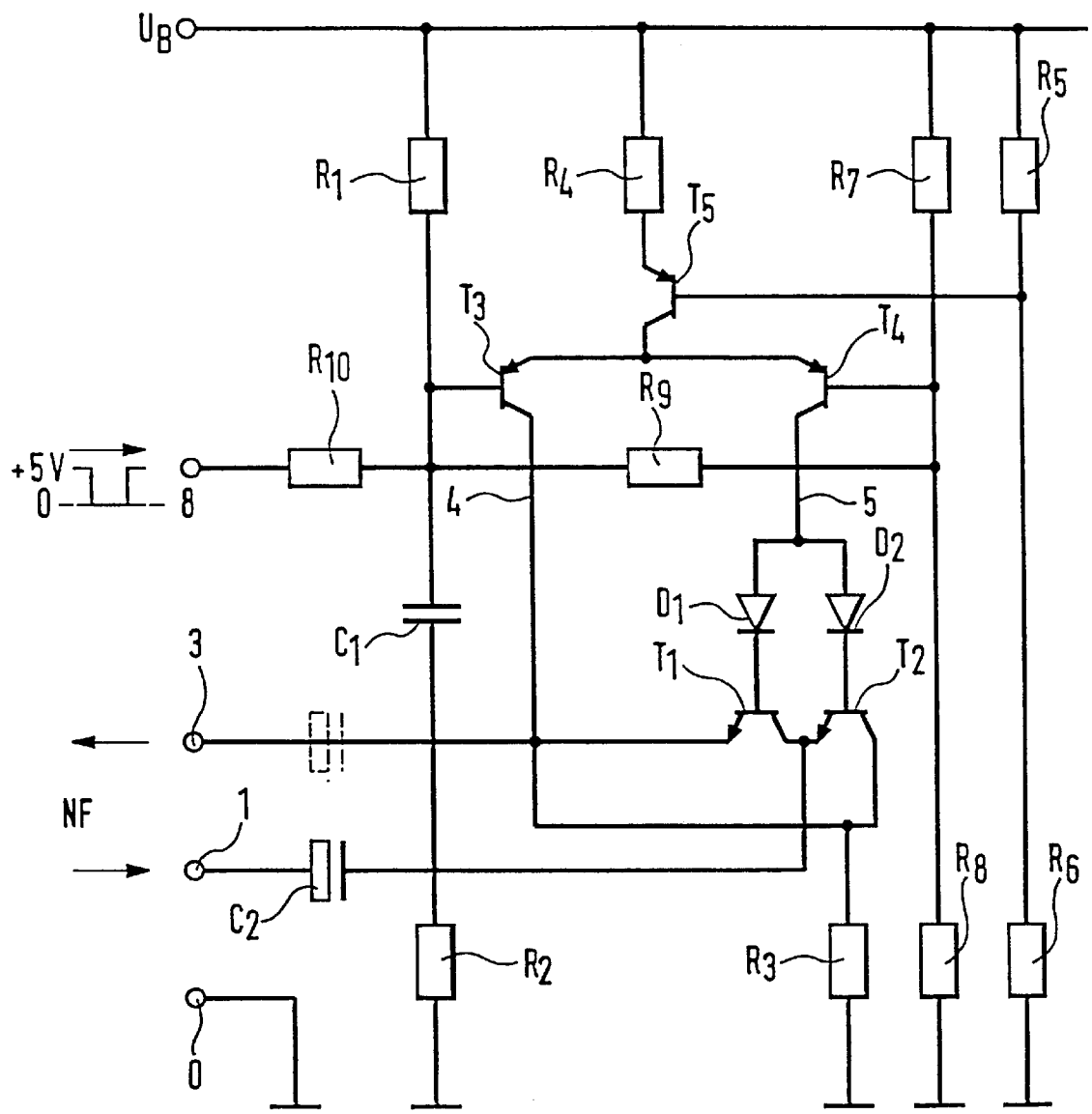
FIG. 2 shows an exemplary embodiment of the novel circuit arrangement.

In the exemplary embodiment of the circuit arrangement shown in FIG. 2, two antiparallel-connected npn transistors $T_1$ and $T_2$ form the aforementioned interrupter 2. The base terminals of the transistors $T_1$ and $T_2$, which are located in the control circuit 5 of the interrupter, are connected to the one output of the reversing switch 6 via rectifiers $D_1$ and $D_2$ assigned to them.

The reversing switch 6 is formed by two parallel pnp transistors $T_3$ and $T_4$, which are connected to a differential circuit by the current branches 4 and 5 connected to their collectors and by the resistor $R_3$. The collector of a further pnp transistor $T_5$ is connected to the emitters of the transistors $T_3$ and $T_4$ and acts as a constant current source 7, and its emitter is connected via a resistor $R_4$ to the terminal for the supply voltage $U_B$ of 8.5 V.

A voltage divider formed by the resistors $R_5$ and $R_6$ is connected between the terminal $U_B$ and ground and determines the operating point of the transistor $T_5$. The base terminal of the transistor $T_5$ is connected to the connecting line located between the resistors $R_5$ and $R_6$. A second voltage divider comprising the resistors $R_7$ and $R_8$, which is likewise located between the terminal $U_B$ and ground, forms the static operating point of the transistor $T_4$ in the differential circuit.

The base of the transistor $T_4$ located at the pickup of the second voltage divider $R_7$, $R_8$ is also connected via a resistor $R_9$ to the high point of the capacitor $C_1$. Also located at its potential is the base of the transistor $T_3$ in the differential circuit. This potential is determined on the one hand, via the resistor $R_{10}$, by the voltage at the blanking pulse input 8, and on the other by the ratio of the resistors $R_1$, $R_2$, of which the resistor $R_1$ is connected to the terminal $U_B$ while the resistor $R_2$ is connected to ground.

The design of the reversing switch 6 as a differential circuit brings about a controlled switching speed of the reversing switch and hence a controlled steepness of the edge in the interruption of the LF signal. An interruption with suitably controlled edge steepness in turn shortens the time required for the LF signal to drop or rise again at a minimal interference spectrum. As a result, a control function of predetermined duration can be performed within a shorter interruption of the LF signal, which markedly improves the avoidance of perceptibility of the interruption.

For the duration of the blanking pulse, the potential at the blanking pulse input 8 is dropped from approximately 5.0 V to 0 V. The voltage values given in the description below are based on the use of npn transistors of type BC 848 C as $T_1$ and $T_2$, and pnp transistors of type BC 858 C as $T_3$, $T_4$ and $T_5$.

FIG. 3 on the left shows the voltage course between the base of the transistor $T_3$ and the base of the transistor $T_4$, which acts as a reference, during the descending edges or in other words at the onset of a blanking pulse, and on the right during the reascending edge, that is, at the end of a blanking pulse. During the state of repose of the blanking line (phase I), the transistor $T_3$ is blocked, and the current from the constant current source $T_5$ flows entirely via the transistor $T_4$, whose base at this time is at approximately 5.5 V. With the onset of the descending edge of the blanking pulse, in switching phase II, the voltage between the control electrodes of the two transistors $T_3$, $T_4$ of the differential amplifier also drops abruptly from approximately +350 mV to approximately +70 mV; this voltage value is determined essentially by the dimensioning of the resistors $R_1$, $R_2$ and $R_9$. The capacitor $C_1$ then begins to charge, and the potential at its high point and hence at the base of the transistor $T_3$ drops further relative to the operating point of the transistor $T_4$, initially approximately linearly to a negative value of approximately 220 mV. With the discharging of the capacitor $C_1$, the current conduction in the two transistors of the differential amplifier begins to vary as well. Once the voltage value of −220 mV is reached, then the variation in the current conduction in the differential amplifier is concluded, and the current flows exclusively via the transistor $T_3$.

The voltage at the high point of capacitor $C_1$ does continue to drop slowly down to approximately −500 mV in phase III. However, this further drop serves the purpose only of security of the new current flow distribution with regard to possible transistor data deviations. The cross-fading from current conduction by the transistor $T_4$ to transistor $T_3$ itself lasts about 0.3 msec.

Figure 4:
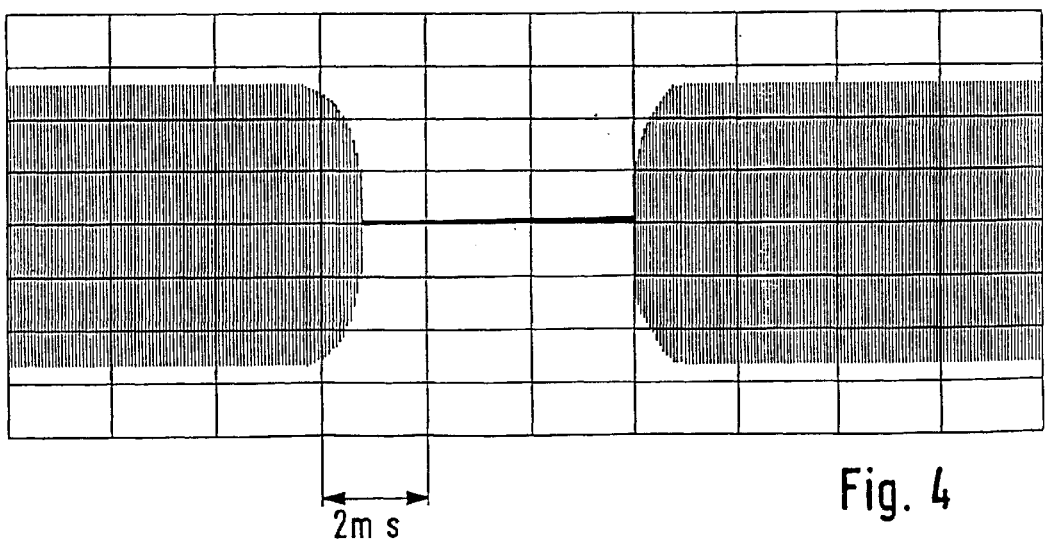
FIG. 4 shows the voltage course at the output of the exemplary embodiment during a blanking pulse.

During the cross-fading, the conductivity of the transistors $T_1$ and $T_2$ that form the reversing switch 2 drops in cosine fashion, resulting in the course indicated in FIG. 4 for the LF signal amplitudes at the LF output 3, which has only a slight interference spectrum.

At the end of the first cross-fading, the current, which has remained unchanged, flows entirely via the transistor $T_3$ and from its collector to ground via the resistor $R_3$; that is, the resistor $R_3$ experiences the same current constantly, so that the operating point, determined by this resistor, of the LF output 3 of the circuit arrangement during and after the cross-fading does not change, and hence the cross-fading causes no DC interference in the circuit, not shown, connected by alternating current to the output 3.

At the end of a blanking pulse, whose duration in FIG. 3 is assumed to be 0.7 ms (approximately 8 ms in actual practice), the reascending edge of the blanking pulse first, in phase IV, causes a voltage jump to approximately −220 mV, and from there, as a consequence of the recharging of the capacitor $C_1$, a nearly linear rise to approximately +70 mV, and after that in phase V to approximately +350 mV, in an exponential course. At the end of the switching pulse as well, the current distribution in the differential amplifier accordingly changes, and this time the cross-fading is effected to current conduction through the transistor $T_4$.

The fadeout of current conduction by the transistor $T_3$ at the onset of a blanking pulse and the fade back in at the end of the blanking pulse also averts a charge reversal of the capacitor $C_2$, so that once again no disadvantageous interference effects are brought about. The longitudinal interruption of the signal also assures interference-free operation in the event of a charge reversal potential of $C_2$ imposed from outside.

| | |
|---|---|
| 1 = LF Input | $C_2$ |
| 2 = Interruptor | $T_1$, $T_2$ |
| 3 = LF Output | $R_3$ |
| 4 = Current Branch | |
| 5 = Current Circuit of the Interruptor | $D_1$, $D_2$ |
| 6 = Reversing Switch = Differential Circuit | $T_3$, $T_4$ |
| 7 = Constant Current Source | $T_5$, $R_4$ |
| 8 = Blanking Pulse Input | $R_{10}$ |

I claim:

1. A circuit arrangement for brief mute switching of the reproduction of an LF signal in a radio receiver, having an interrupter, which is disposed in the LF signal path and which, for the duration of a blanking pulse delivered to the circuit arrangement, effects a suppression of the LF signal reproduction at the LF signal output connected to ground via a resistor, and which is controlled by the charge state of a capacitor acted upon by the blanking pulse, characterized in that a control path of the interrupter (2) forms a part of the first current branch (5); that located parallel to the first current branch (5) is another, second current branch (4); that both current branches (4, 5) are connected on the one hand to the resistor (R3) and on the other to a reversing switch (6) supplied by a constant current source (7); that one input of the reversing switch (6) is connected to the capacitor ($C_1$); and that the current distribution to the first and/or second current branch (4, 5) in the reversing switch (6) is determined as a function of the charge state of the capacitor ($C_1$).

2. The circuit arrangement of claim 1, characterized in that the interrupter (2) is made up of two antiparallel-connected transistors ($T_1$, $T_2$) of the same conduction type.

3. The circuit arrangement of claim 2, characterized in that the base paths of both transistors ($T_1$, $T_2$) are connected via parallel-connected diodes ($D_1$, $D_2$) to the one input of the reversing switch (6).

4. The circuit arrangement of claim 1, characterized in that both transistors ($T_3$, $T_4$) in the reversing switch (6), together with the current circuits (4, 5, $R_3$) connected to their collectors, form a differential circuit, wherein the base of the one transistor ($T_4$) is connected via a resistor and the base of the other transistor ($T_3$) is connected directly to the high point of the capacitor ($C_1$); and that the potential at the high point of the capacitor determines the current distribution in the differential circuit.

5. The circuit arrangement of claim 4, characterized in that the blanking pulse is applied via a resistor ($R_{10}$) to the high point of the capacitor.

6. The circuit arrangement of claim 5, characterized in that the high point of the capacitor ($C_1$) is connected to the voltage source ($U_B$) via a resistor ($R_1$), and the low point of the capacitor ($C_1$) is connected to ground via a resistor ($R_2$).

* * * * *